United States Patent
Mardi

(10) Patent No.: US 10,168,384 B2
(45) Date of Patent: Jan. 1, 2019

(54) MODULAR TESTING SYSTEM WITH VERSATILE ROBOT

(71) Applicant: Xilinx, Inc., San Jose, CA (US)

(72) Inventor: Mohsen H. Mardi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 154 days.

(21) Appl. No.: 15/213,177

(22) Filed: Jul. 18, 2016

(65) Prior Publication Data

US 2018/0017619 A1  Jan. 18, 2018

(51) Int. Cl.
| | | |
|---|---|---|
| G01R 31/28 | (2006.01) |
| G06K 7/14 | (2006.01) |
| B25J 9/16 | (2006.01) |
| B25J 9/00 | (2006.01) |
| B25J 11/00 | (2006.01) |
| B25J 21/00 | (2006.01) |
| G06K 7/10 | (2006.01) |

(52) U.S. Cl.
CPC ........ *G01R 31/2893* (2013.01); *B25J 9/0096* (2013.01); *B25J 9/1664* (2013.01); *B25J 11/0095* (2013.01); *B25J 21/00* (2013.01); *G06K 7/10297* (2013.01); *G06K 7/1413* (2013.01); *Y10S 901/09* (2013.01)

(58) Field of Classification Search
CPC ............. G01R 31/26–31/31937; H01L 23/544
See application file for complete search history.

(56) References Cited

U.S. PATENT DOCUMENTS

| | | | | |
|---|---|---|---|---|
| 5,621,312 A | * | 4/1997 | Achor ................. | G01R 35/005 324/750.06 |
| 6,218,852 B1 | * | 4/2001 | Smith ................ | G01R 31/2806 324/757.02 |
| 2004/0260665 A1 | * | 12/2004 | Hamilton ............... | G06Q 10/08 706/45 |
| 2005/0000974 A1 | * | 1/2005 | Chirnomas ............... | G07F 5/18 221/9 |
| 2005/0001035 A1 | * | 1/2005 | Hawley .............. | G06K 7/10851 235/462.21 |
| 2005/0280503 A1 | * | 12/2005 | Lee ........................ | H01L 23/544 340/10.1 |
| 2006/0066293 A1 | * | 3/2006 | Gopal ................ | G01R 31/2849 324/750.14 |

(Continued)

*Primary Examiner* — Huy Q Phan
*Assistant Examiner* — David Fredericksen
(74) *Attorney, Agent, or Firm* — Keith Taboada

(57) ABSTRACT

A chip package assembly testing system and method for testing a chip package assembly are provided herein. In one example, the testing system includes a robot disposed in an enclosure and having a range of motion operable to transfer a chip package assembly between any of a first queuing station, a second queuing station and a plurality of test stations. The system also includes an automatic identification and data capture (AIDC) device operable to read an identification tag affixed to a carrier disposed in the first and second queuing stations, and a controller configured to control placement of chip package assemblies by the robot in response information obtained from a carrier disposed in at least one of the first and second queuing stations, the predefined test routine of the test processor of the first test station, and the predefined test routine of the test processor of the second test station.

20 Claims, 6 Drawing Sheets

(56) References Cited

U.S. PATENT DOCUMENTS

2008/0297140 A1* 12/2008 An .................... G01R 31/2893
                                              324/757.01
2009/0024324 A1*  1/2009 Clark ................ G01R 31/2893
                                              702/1

* cited by examiner

US 10,168,384 B2

MODULAR TESTING SYSTEM WITH VERSATILE ROBOT

TECHNICAL FIELD

Embodiments of the present invention generally relate to a modular testing system with a versatile robot, and in particular, to a modular chip package assembly testing system with a versatile robot.

BACKGROUND

Electronic devices, such as tablets, computers, copiers, digital cameras, smart phones, control systems and automated teller machines, among others, often employ electronic components which leverage chip package assemblies for increased functionality and higher component density. As chip package assemblies become larger and more complex, testing of the chip package assemblies becomes more time consuming and difficult, which undesirable increases the unit manufacturing cost. Simply making larger and more sophisticated testing equipment is not a desirable solution due to the high cost of floor space in typical fabrication facilities and high capital costs for larger and more complex equipment.

Therefore, a need exists for an improved testing system suitable for testing chip package assemblies in a production environment.

SUMMARY

A chip package assembly testing system and method for testing a chip package assembly are provided herein. In one example, the testing system includes a robot disposed in an enclosure and having a range of motion operable to transfer a chip package assembly between any of a first queuing station, a second queuing station and a plurality of test stations disposed within the enclosure. The system also includes an automatic identification and data capture (AIDC) device operable to read an identification tag affixed to a carrier disposed in either of the first and second queuing stations, and a controller configured to control placement of chip package assemblies by the robot in response information obtained from reading the tag coupled to a carrier disposed in at least one of the first and second queuing stations, the predefined test routine of the test processor of the first test station, and the predefined test routine of the test processor of the second test station.

In another example, a chip package assembly testing system a robot disposed in an enclosure and having a range of motion operable to transfer a chip package assembly between any of a first queuing station, a second queuing station and a plurality of test stations disposed in the enclosure. The system also includes an automatic identification and data capture (AIDC) device coupled to the robot and operable to read an identification tag affixed to a carrier disposed in the first and second queuing stations. A controller is provided that is configured to control placement of chip package assemblies by the robot in response information obtained from reading the tag coupled to a carrier disposed in at least one of the first and second queuing stations, the predefined test routine of the test processor of the first test station, the predefined test routine of the test processor of the second test station, and test data obtained in the test stations.

In another example, a method for testing a chip package assembly is provided that includes disposing a first carrier containing a first plurality of chip package assemblies for testing within an enclosure of a modular chip package assembly testing system, determining a type of chip package assembly disposed in the first carrier using an automatic identification and data capture (AIDC) device coupled to a robot, disposing a second carrier containing a second plurality of chip package assemblies for testing within the modular chip package assembly testing system, determining a type of chip package assembly disposed in the second carrier using the AIDC device, and transferring a first chip package assembly of the first plurality of chip package assemblies disposed in the first carrier to either a first test station or a second test station based on the type of chip package assembly and a test routine to be performed in the respective test station.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly testing system and method for testing chip package assemblies disclosed herein improve testing throughput without increasing space requirements as compared to conventional test systems. Moreover, the chip package assembly testing system is flexible in that the test system may be configured to simultaneously test different types of testing chip package assemblies. The chip package assembly testing system may also be configured to sort tested chip package assemblies for more efficient handling. Furthermore, the modularly of the chip package assembly testing system allow additional queuing or test stations to be added thereby enabling changing production demands to be met with limited additional capital expenditures or down time for system reconfiguration.

Exemplary chip package assemblies generally include at least one or more integrated circuit (IC) dice disposed on a package substrate. In some embodiments, an interposer may be utilized to provide improved interconnection between two or more dice, and/or the dice and the package substrate. The IC die may be a programmable logic device, such as field programmable gate arrays (FPGA), a memory device, an optical device, a MEMS device, a processor or other IC logic or memory structure. Optical devices include photodetectors, lasers, optical sources, and the like. The functionality of the IC die is provided by solid state circuitry formed in the die. At the end of the chip package assembly fabrication process, the chip package assemblies are tested to ensure robust and predictable performance.

Figure 1:
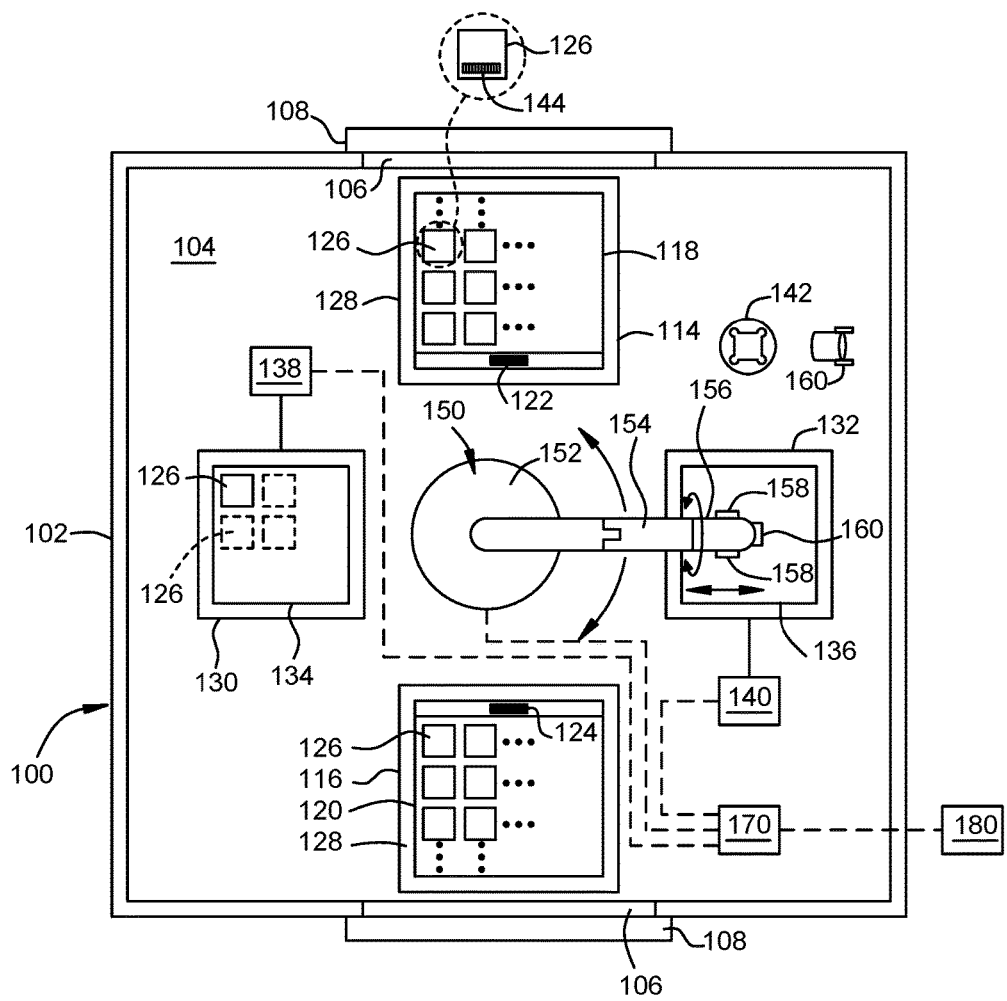
FIG. 1 is a schematic top view of a chip package assembly testing system.

FIG. 1 is a schematic top view of a chip package assembly testing system 100 suitable for chip package assemblies 126. The modular chip package assembly testing system 100 generally includes an enclosure 102 having in interior region 104. At least a first queuing station 114, a plurality of test stations, a robot 150 and automatic identification and data capture (AIDC) device 160 are disposed in the interior region 104 of the enclosure 102. The robot 150 has a range of motion operable to transfer a chip package assembly 126 between any of the queuing and test stations of the testing system 100.

The modular chip package assembly testing system 100 also includes a controller 170 that is utilized to control the operation of the chip package assembly testing system 100, including the operation of the robot 150 and handling information read by the AIDC device 160. The controller 170 generally includes a central processing unit (CPU), memory, and support circuits utilized to control the operation of the chip package assembly testing system 100. The CPU may be any form of general purpose computer processor that may be used in an industrial setting. A software routine or a series of program instructions are stored in the memory, such as random access memory, read only memory, floppy, or hard disk drive, or other form of digital storage. The support circuit is conventionally coupled to the CPU and may include cache, clock circuits, input/output systems, power supplies, and the like.

The controller 170 is generally interfaced with the AIDC device 160 to track information uniquely related to each chip package assembly 126. For example, each chip package assembly 126 may include a machine readable identification (ID) tag 144 associated with each chip package assembly 126. In one example, the identification tag 144 is coupled to each chip package assembly 126, for example, by printing, embossing, laser etching, labeling or bonding, among others.

The ID tag 144 may be a bar code, radio frequency (RF) transponder (i.e., RFID tag) or other machine readable tag. Accordingly, the AIDC device 160 must be of a type compatible for reading the type of machine readable information tag being utilized. In one example, the AIDC device 160 may be a RFID reader, a barcode reader, a camera or other suitable tag reading device.

The ID tag 144 is associated with a discreet file of information stored or accessible by the memory of the controller 170. The discreet file associated with the ID tag 144 may be inputted through a user interface of the controller 170, by communicated to the controller 170 from a remote host processing system 180. The information associated with the ID tag 144 may include one or more of, but is not limited to, a unique chip package assembly identification number, the type of chip package assembly 126, test results for the chip package assembly 126 (such as pass, fail or test data), defect information, and location of the chip package assembly 126 within the testing system 100, among other information.

The first queuing station 114 is configured to receive at least a first carrier 118 containing a plurality of chip package assemblies 126 for testing within the chip package assembly testing system 100. For example, the first queuing station 114 may include a support surface 128 adapted to hold the first carrier 118 (and/or other chip package assembly carriers) in a position suitable for picking and placing (i.e., transfer) of the chip package assemblies 126 from the first carrier 118 by the robot 150.

The first queuing station 114 is disposed immediately adjacent an access port 106 formed through the enclosure 102. The access port 106 is sized to allow passage of the first carrier 118 therethrough. A cover 108 is utilized to open and close the access port 106. With the access port 106 in an open state with the cover 108 removed, the first carrier 118 may be transferred into the enclosure 102 and placed on the support surface 128 of the first queuing station 114, or the first carrier 118 removed from the first queuing station 114 in a similar manner. When the first carrier 118 is not being transferred through the access port 106 of the enclosure 102, the access port 106 may be closed by the cover 108 to help maintain the cleanliness of the interior region 104 of the chip package assembly testing system 100.

The first carrier 118 is generally segmented into regions that hold one of the chip package assemblies 126 disposed on the first carrier 118. Each region may be identified by a specific coordinate system of the first carrier 118, so that the controller 170 or other processor may know which chip package assembly 126 resides in a specific unique region of the first carrier 118. For example, the regions may be arranged in rows and columns such that a particular region of the first carrier 118 would have a unique row and column number combination. By associating the unique region of the first carrier 118 with the specific chip package assembly 126 disposed therein, the identity, test information and other information may be associated and tracked for that uniquely identified chip package assembly 126 in instances wherein the chip package assembly 126 does not have an ID tag 144. That uniquely identified chip package assembly 126 tracked by the controller 170 as the chip package assembly 126 moves within the testing system 100 by robot 150, and may be associated with a different unique region on the first carrier 118 or other carrier should the robot 150 return the chip package assembly 126 to a different carrier from where the chip package assembly 126 was originally picked.

The first carrier 118 also includes a first information tag 122 that is machine readable by the AIDC device 160. The first information tag 122 may be a bar code, radio frequency (RF) transponder (i.e., RFID tag) or other machine readable tag. Accordingly, the AIDC device 160 must be of a type compatible for reading the type of machine readable information tag being utilized.

The first information tag 122 is associated with a discreet file of information stored or accessible by the memory of the controller 170. The discreet file associated with the first information tag 122 may be inputted through a user interface of the controller 170, by communicated to the controller 170 from a remote host processing system 180. The information associated with the first information tag 122 may include, but is not limited to, one or more of a unique carrier identification number, the type of chip package assemblies 126 contained in the carrier bearing the tag (e.g., the first carrier 118), identification of specific chip package assemblies 126 (for example, by row and column location, or by serial number) contained in the first carrier 118, test results for specific chip package assemblies 126 contained in the first carrier 118, and defect information for specific chip package assemblies 126 contained in the first carrier 118, among other information.

The controller 170 may manage the information associated with the first information tag 122, and/or the ID tag 144. For example, information regarding test results (such as pass, fail or specific performance matrix such as power consumption, resistance, RC delay, temperature rise and the like) may be added to the file associated with a specific chip package assembly 126 contained in the first carrier 118 associated with the first information tag 122 and/or ID tag 144. Additionally, should a specific chip package assembly 126 contained in the first carrier 118 be transferred to another carrier having its own unique information tag, the information associated with that chip package assembly 126 may be removed from the file associated with the first information tag 122 and added to the information associated with the information tag affixed to the other carrier.

Although the information is generally associated to batches and/or specific chip package assemblies 126 through unique information tags affixed to a carrier, as discussed above, when the chip package assemblies 126 themselves include a machine readable unique ID tag 144, the AIDC device 160 and controller 170 may be utilized to track and store information associated with those chip package assemblies 126 without associating particular chip package assemblies 126 to a specific carrier.

In the example depicted in FIG. 1, the modular chip package assembly testing system 100 additionally includes at least a second queuing station 116 disposed in the interior region 104. The second queuing station 116 includes a support surface 128 that is configured to receive a second carrier 120 containing a plurality of chip package assemblies 126 for testing within the modular chip package assembly testing system 100.

The second carrier 120 may be configured essentially identical to the first carrier 118 described above, except wherein the second carrier 120 includes a second information tag 124. The second information tag 124 is essentially identical to the first information tag 122 described above except wherein the second information tag 124 is uniquely associated with a discreet information stored or accessible by the memory of the controller 170 that is different than the information associated with the first information tag 122.

The chip package assembly testing system 100 may also include a precisor 142. The precisor 142 aligns and/or conditions the solder bumps on the bottom of the chip package assembly 126 so that the chip package assembly 126 is not damaged when interfaced with the test stations of the testing system 100 or end use printed circuit board.

In one example, the robot 150 transfers the chip package assemblies 126 from the queuing stations 114, 116 to the precisor 142 for conditioning of the solder bumps prior to transferring the chip package assemblies 126 to the test stations of the testing system 100.

In one example, the AIDC device 160 may be positioned proximate the precisor 142 for identifying the chip package assembly 126. Positioning the AIDC device 160 where the AIDC device 160 may read the ID tag 144 disposed on each chip package assembly 126 while in the precisor 142 is advantageous because each chip package assembly 126 must pass through the precisor 142 just prior to testing.

In another example, the AIDC device 160 may be in a location between the queuing stations 114, 116 and the test stations 130, 132 where ID tag 144 disposed on each chip package assembly 126 may be read while the chip package assembly 126 is being transferred by the robot 150.

By identifying the chip package assembly 126 through its ID tag 144 as the chip package assembly 126 immediately prior to the robot 150 transferring the chip package assembly 126 to the test stations of the testing system 100 advantageously simplifies programming and tracking of each chip package assembly 126, and allows test results to be readily be associated with the tested chip package assembly 126 without elaborate tracking routines.

As discussed above, a plurality of test stations are disposed in the interior region 104 of the enclosure 102. In the example depicted in FIG. 2, a first test station 130 and a second test station 132 are shown. However, it is contemplated that any number of test stations may be utilized as long as there is room within the enclosure 102, and that the robot 150 may access all of the test stations.

Each of the test stations 130, 132 include an interface 134, 136 configured to receive and communicatively connect with at least one chip package assembly 126 in a manner that enables testing to be performed on the chip package assembly 126. The interfaces 134, 136 may include one or more chip sockets, daughter boards, probers or other electrical interface suitable for establishing communication between the chip package assembly 126 and the testing circuitry of the test stations 130, 132. In one example, both of the interfaces 134, 136 may configured to accept the same type of chip package assembly 126, thus enabling greater testing throughput. In another example, each of the interfaces 134, 136 may configured to accept a different type of chip package assembly 126, thus enabling different types of chip package assemblies 126 to be tested simultaneously.

The first interface 134 may be configured to accept a single chip package assembly 126 or multiple chip package assemblies 126. The first interface 134 may be readily removed and replaced on the first test station 130 with another interface configured to interface with a different number and/or type of chip package assemblies 126. Thus, the ability to swap the first interface 134 with other interfaces allows the first test station 130 to be readily adapted to meet production needs with minimal cost and down time. The second interface 136 is similarly configured.

The first test station 130 includes a first test processor 138. The first test processor 138 generally includes a central processing unit (CPU), memory, and support circuits utilized to control the operation of the first test station 130. The CPU may be any form of general purpose computer processor that may be used in an industrial setting. A software routine or a series of program instructions are stored in the memory, such as random access memory, read only memory, floppy, or hard disk drive, or other form of digital storage. The support circuit is conventionally coupled to the CPU and may include cache, clock circuits, input/output systems, power supplies, and the like. The first test processor 138 is coupled to the chip package assembly 126 connected to the first interface 134 of the first test station 130.

A test routine (e.g., predetermined test routine) is stored or accessible by the first test processor 138. The test routine may be inputted into the first test processor 138 through a user interface, or uploaded or accessed from the controller 170 and/or host processing system 180. The first test processor 138 executes the test routine in a manner that runs a predefined test on the one or more chip package assemblies 126 coupled to the first interface 134 of the first test station 130. The test routine may be one or more of a DC test routine, a burn-in routine, post burn-in routine, a final test routine or other predefined test routing to be performed on the chip package assembly 126.

In one example, a DC test routine is performed on chip package assembly 126 disposed in the first test station 130. The DC test routine may include subjecting the chip package assembly 126 to a high DC load for a period to time, and testing the chip package assembly 126 a short, resistance, temperature rise, RC delay, speed, other performance characteristic or malfunction or other defect. The DC test routine may include adding test information, such as pass, fail or other performance information, to the information stored on the controller 170 and uniquely associated with the tested chip package assembly 126. The results of the DC test routine may also be utilized by the controller 170 to direct the transfer of the tested chip package assembly 126 to a particular carrier or region of a carrier based on the test results. For example, all chip package assemblies 126 passing the DC test routine may be transferred to adjoining regions of a selected carrier such that all passing chip package assemblies 126 are grouped together on the carrier separated from all chip package assemblies 126 that have failed the DC test routing. In another example, all chip package assemblies 126 passing the DC test routine may be transferred to one carrier, for example, the first carrier 118, while all chip package assemblies 126 failing the DC test routine may be transferred to a different carrier, for example, the second carrier 120.

In another example, a burn-in test routine is performed on chip package assembly 126 disposed in the first test station 130. The burn-in test routine may include subjecting the chip package assembly 126 to a high-stress environment, such as high voltage, high amperage, high temperature and/or high frequency electric signals. The burn-in test routine may include subjecting the chip package assembly 126 to a high-stress environment for a period to time, and testing the chip package assembly 126 a short, resistance, temperature rise, RC delay, speed, other performance characteristic or malfunction or other defect. The burn-in test routine may include adding test information, such as pass, fail or other information, to the information stored on the controller 170 and uniquely associated with the tested chip package assembly 126. The results of the burn-in test routine may also be utilized by the controller 170 to direct the transfer of the tested chip package assembly 126 to a particular carrier or region of the carrier based on the test results, such as discussed above.

In yet another example, a post burn-in test routine is performed on chip package assembly 126 disposed in the first test station 130. The post burn-in test routine may include testing the electrical characteristics and function of the chip package assembly 126 at room temperature and below room temperature. The post burn-in test routine may include subjecting the chip package assembly 126 to a room temperature environment for a period to time, and testing the electrical characteristics and function of the chip package assembly 126. The post burn-in test routine may also include subjecting the chip package assembly 126 to a sub-room temperature environment for a period to time, and testing the electrical characteristics and function of the chip package assembly 126. The post burn-in test routine may include adding test information, such as performance, functionality, pass, fail or other performance information, to the information stored on the controller 170 and uniquely associated with the tested chip package assembly 126. Other performance may include, but is not limited to, one or more of resistance, temperature rise, RC delay, speed, malfunction or other defect The results of the post burn-in test routine may also be utilized by the controller 170 to direct the transfer of the tested chip package assembly 126 to a particular carrier or region of the carrier based on the test results, such as discussed above.

In still yet another example, a final test routine is performed on chip package assembly 126 disposed in the first test station 130. The final test routine may include testing the electrical characteristics and function of the chip package assembly 126 at a temperature elevated above room temperature (e.g., elevated temperature). The final test routine may include subjecting the chip package assembly 126 to an elevated temperature environment for a period to time, and testing the electrical characteristics and function of the chip package assembly 126. The final test routine may include adding test information, such as performance, functionality, pass, fail or other performance information, to the information stored on the controller 170 and uniquely associated with the tested chip package assembly 126. The results of the final test routine may also be utilized by the controller 170 to direct the transfer of the tested chip package assembly 126 to a particular carrier or region of the carrier based on the test results, such as discussed above.

In yet another example, the final test routine performed on chip package assembly 126 may mimic operating conditions of the device in which the chip package assembly 126 will be interfaced with. The operating conditions of the final test routine may include temperature variation and voltage fluxations.

It is contemplated that other test routines may be performed in the first test station 130 or other test station within the testing system 100.

In the embodiment depicted in FIG. 1, the testing system 100 includes a second test station 132. The second test station 132 may be separated from first test station 130 by the robot 150. The second test station 132 may be separated from first test station 130 by one or more of the queuing stations 114, 116. The second test station 132 is configured similar to the first test station 130. The second test station 132 includes a second test processor 140. The second test processor 140 is configured similar to the first test processor 138 and generally includes a central processing unit (CPU), memory, and support circuits utilized to control the operation of the second test station 132.

A test routine (e.g., predetermined test routine) is stored or accessible by the second test processor 140. The test routine run by the second test processor 140 may be the same or different than the test routine run by the first test processor 138. When the test routines run by the test processors 138, 140 are identical, or at least for the same type of chip package assemblies 126, test throughput may be enhanced compared to conventional testing systems. When the test routines run by the test processors 138, 140 are for different types of chip package assemblies 126, the testing system 100 advantageously may simultaneously test two different types chip package assemblies 126, and in some embodiment, sort defective tested chip package assemblies 126 to a common carrier to conserve space and deduce overall testing time for a batch of chip package assemblies 126.

As discussed above, the robot 150 is disposed in the disposed in the interior region 104 and has a range of motion operable to transfer a chip package assembly 126 between any of the queuing stations 114, 116 and the test stations 130, 132. In one example, the robot 150 includes a robot base 152, a robot linkage 154, a robot wrist 156, and at least one robot end effector 158. The robot base 152 may be centrally located within the enclosure 102, and in one embodiment, is surrounded by the queuing and test stations 114, 116, 130, 132. The robot linkage 154 is coupled at a proximal end to the robot base 152. Motors within the robot base 152 are operable to rotate the robot linkage 154 up to 360 degrees around the robot base 152.

The robot wrist 156 is coupled to a distal end of the robot linkage 154. The at least one robot end effector 158 is coupled to robot wrist 156.

The robot end effector 158 is generally configured to facilitate picking and placing of the chip package assemblies 126 by the robot 150 between the various stations of the testing system 100. In the example illustrated in FIG. 1, the robot 150 includes at least two robot end effectors 158. As later described below, having at least two robot end effectors 158 permits more efficient transfer of the chip package assemblies 126 within the testing system 100.

The robot linkage 154 is configured to extend and retract the robot end effector 158 and the robot wrist 156 radially relative to the robot base 152. The robot linkage 154 may also be configured to control the elevation of the robot end effector 158 within the enclosure 102. Alternatively, the robot base 152 may include actuators configured to control the elevation of the robot linkage 154 and robot end effector 158 coupled thereto.

The robot wrist 156 also allows the robot end effector 158 to be rotated relative to the robot linkage 154. The rotation of the robot wrist 156 and motion of the robot linkage 154 allows the robot end effector 158 to be orientated in a manner, for example in an orientation normal to the support surface 128 of the carriers, that allows a selected one of the chip package assemblies 126 to be picked up from or placed on any one of the queuing and test stations 114, 116, 130, 132.

The robot end effector 158 is generally configured to selectively secure the chip package assembly 126 to the robot 150 during transfer between the carriers 118, 120 disposed on the queuing stations 114, 116 and the test stations 130, 132. In other words, the robot end effector 158 enables the picking and placing of the chip package assemblies 126 between any one of the queuing stations 114, 116 and the test stations 130, 132 by the robot end effector 158.

Also as illustrated in the embodiment depicted in FIG. 1, the AIDC device 160 is coupled to the robot 150 in a location suitable to read the identification tags 122, 124 affixed to the carriers 118, 120 disposed on the first and second queuing stations 114, 116. For example the AIDC device 160 may be coupled to one of the distal end of the robot linkage 154, the robot wrist 156 or robot end effector 158 such that the AIDC device 160 may be readily positioned by the robot 150 in a location over or proximate to the queuing stations 114, 116 where the tags 122, 124 may be reliably read by the AIDC device 160. Alternatively, one or more AIDC devices 160 may be located within the enclosure 102 to enable identification of the particular carriers 118, 120 disposed in the queuing stations 114, 116.

Figure 2:
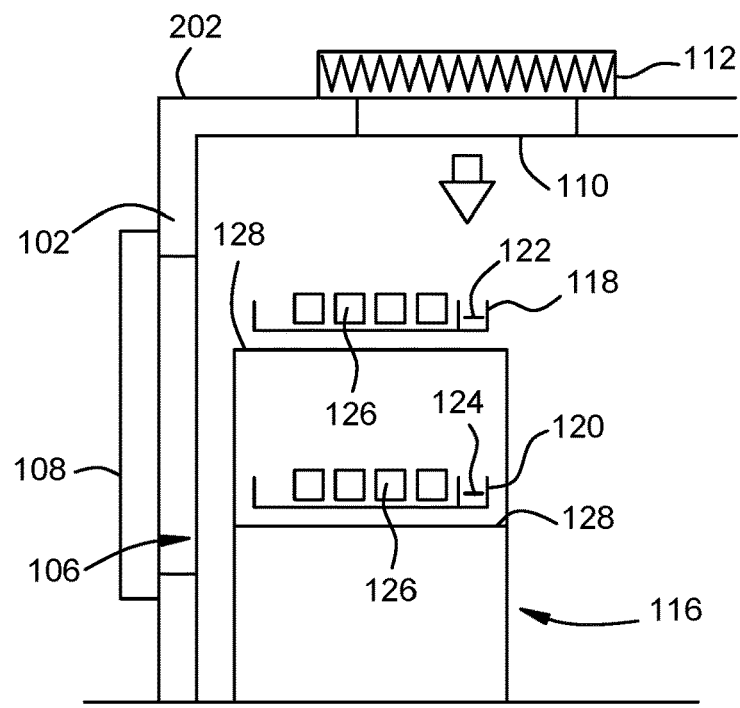
FIG. 2 is a schematic side view of a portion of the chip package assembly testing system of FIG. 1 illustrating an example of a queuing station.

FIG. 2 is a schematic side view of a portion of the chip package assembly testing system 100 of FIG. 1 illustrating one example of the first queuing station 114 configured to accept multiple carriers. In the example depicted in FIG. 2, a first carrier 118 is disposed on a first support surface 128 of the first queuing station 114 while a second carrier 120 is disposed on a second support surface 128 of the first queuing station 114. The first and second support surfaces 128 may be at different elevations within the queuing station 116. For example, the first and second support surfaces 128 may be disposed one on top of the other such that the first and second carriers 118, 120 are stacked within the queuing station 116, thus allowing an increased number of carriers, and consequently, an increased number of chip package assemblies 126 to be disposed in a single queuing station without increasing the foot print. The distance between the first and second support surfaces 128 provides adequate distance between the first and second carriers 118, 120 to enable access to all the chip package assemblies 126 disposed on the carriers 118, 120 by the robot 150.

Also as shown in FIG. 2, the access port 106 is sized to accommodate transfer of the carriers 118, 120 from the support surfaces 128. As discussed above, the access port 106 may be closed by a cover 108 during operation of the testing system 100.

To assist preventing contamination of the chip package assemblies 126 disposed on the carriers 118, 120, the enclosure 102 may optionally include an inlet vent 110 for providing filtered air into the interior region 104 of the enclosure 102. The filtered air may be provided by one or more air filters 112 mounted to an exterior of the enclosure 102 or other suitable location.

Figure 3:
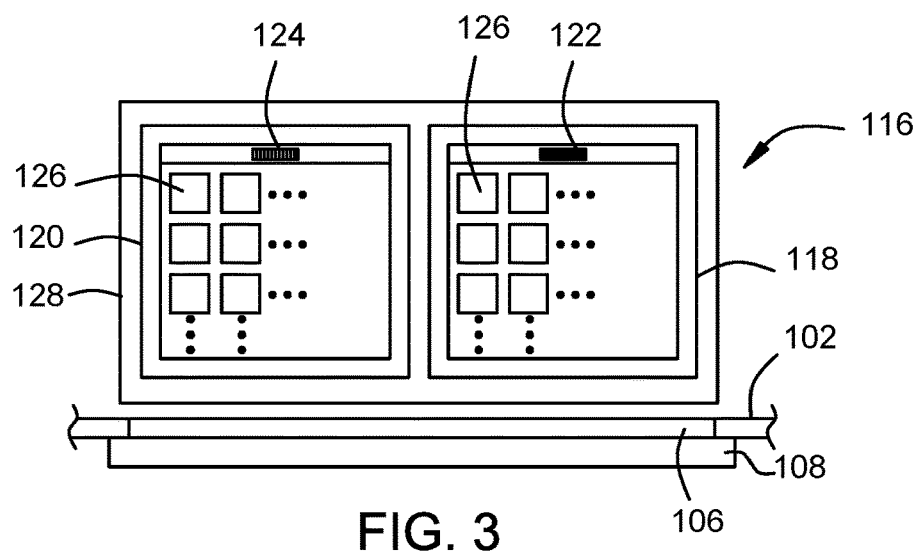
FIG. 3 is a schematic side view of a portion of the chip package assembly testing system of FIG. 1 illustrating another example of a queuing station.

FIG. 3 is a schematic side top of a portion of the chip package assembly testing system 100 of FIG. 1 illustrating another example of the first queuing station 114 configured to accept multiple laterally spaced carriers. In the example depicted in FIG. 3, at least two carriers 118, 120 are disposed in a laterally separated orientation in the first queuing station 114. In one embodiment, the at least two laterally spaced carriers 118, 120 may be disposed on a common single support surface 128. The laterally spaced carriers 118, 120 advantageously allow access to the chip package assemblies 126 by a simpler and less expensive robot as compared to robots that require a greater range of motion to accommodate carriers at different elevations.

Although not shown, the first queuing station 114 configured to accept at least two laterally carriers 118, 120 may also include a second support surface 128 disposed at a lower elevation within the first queuing station 114 as shown in FIG. 2.

Also as shown in FIG. 3, the access port 106 is sized to accommodate transfer of the laterally spaced carriers 118, 120 from the first carrier 118. As discussed above, the access port 106 may be closed by a cover 108 during operation of the testing system 100.

FIGS. 4A-4F are schematic side views of a test station illustrating one example of a sequence for transferring chip package assemblies with the test station. Although the sequence illustrated in FIGS. 4A-4F is preformed utilizing the test station 130, the technique shown for handing off one chip package assembly 126 and picking up another chip package assembly 126 by the robot 150 may be performed similarly in any of the stations described herein.

Figure 4A:
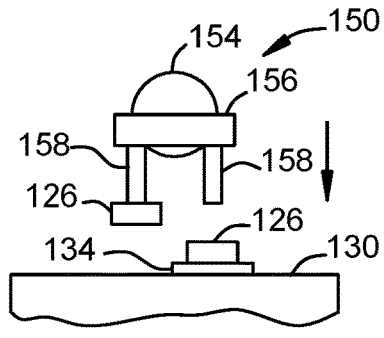
FIGS. 4A-4F are schematic side views of a test station illustrating one example of a sequence for transferring chip package assemblies with the test station.

Referring first to FIG. 4A, the robot 150 is shown having a first chip package assembly 126 held by one of the robot end effectors 158 of the robot 150, while the other robot end effector 158 is free (i.e., empty). The first chip package assembly 126 held by the robot end effector 158 is to be tested in the test station 130. A second chip package assembly 126 shown coupled to the interface 134 of the test station 130 has completed testing while disposed in the test station 130.

Figure 4B:
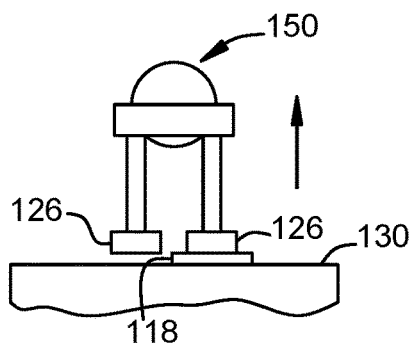
Figure 4C:
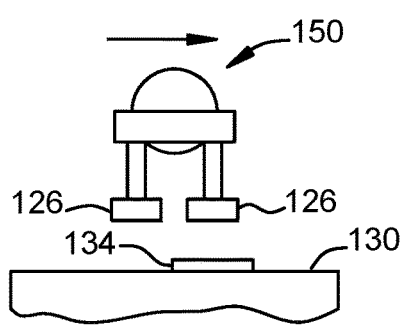

As illustrated in FIG. 4B, the robot 150 lowers the free robot end effector 158 to engage the tested second chip package assembly 126 disposed in the test station 130. After the robot end effector 158 of robot 150 secures the tested second chip package assembly 126, the robot wrist 156 is raised by the robot 150 such that both the untested first tested chip package assembly 126 and the tested second chip package assembly 126 are raised above the test station 130, as illustrated in FIG. 4C. With the chip package assemblies 126 clear of the interface 134 of the test station 130, the robot 150 moves laterally to position the first chip package assembly 126 over the interface 134 of the test station 130.

Figure 4D:
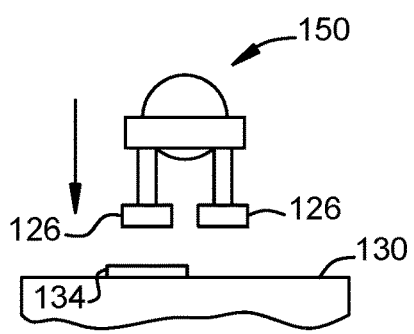

Once the first chip package assembly 126 over the interface 134 of the test station 130, the robot wrist 156 is lowered by the robot 150 such that the untested first chip package assembly 126 is moved engaged and communicatively coupled with the interface 134 of the test station 130, as illustrated in FIG. 4D.

Figure 4E:
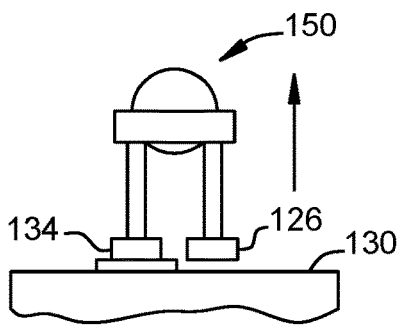
Figure 4F:
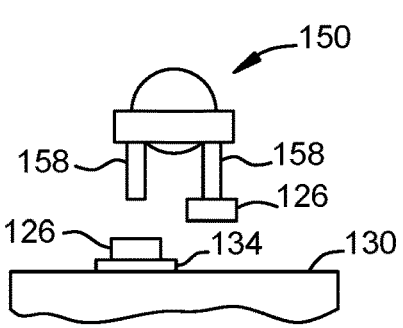

As illustrated in FIGS. 4E-4F, the robot end effector 158 releases the first chip package assembly 126 that is now communicatively coupled with the interface 134 of the test station 130, and the second chip package assembly 126 elevated clear of the test station 130. The first chip package assembly 126, now communicatively coupled to the interface 134 of the test station 130, is tested in the test station 130 as described above.

Thus, as illustrated in FIGS. 4A-4F, the use of two robot end effectors 158 allows faster loading and unloading of the test station 130. Accordingly, faster loading and unloading results in faster throughput through the test station 130, and ultimately lower costs for manufacturing and testing the chip package assemblies 126.

Figure 5:
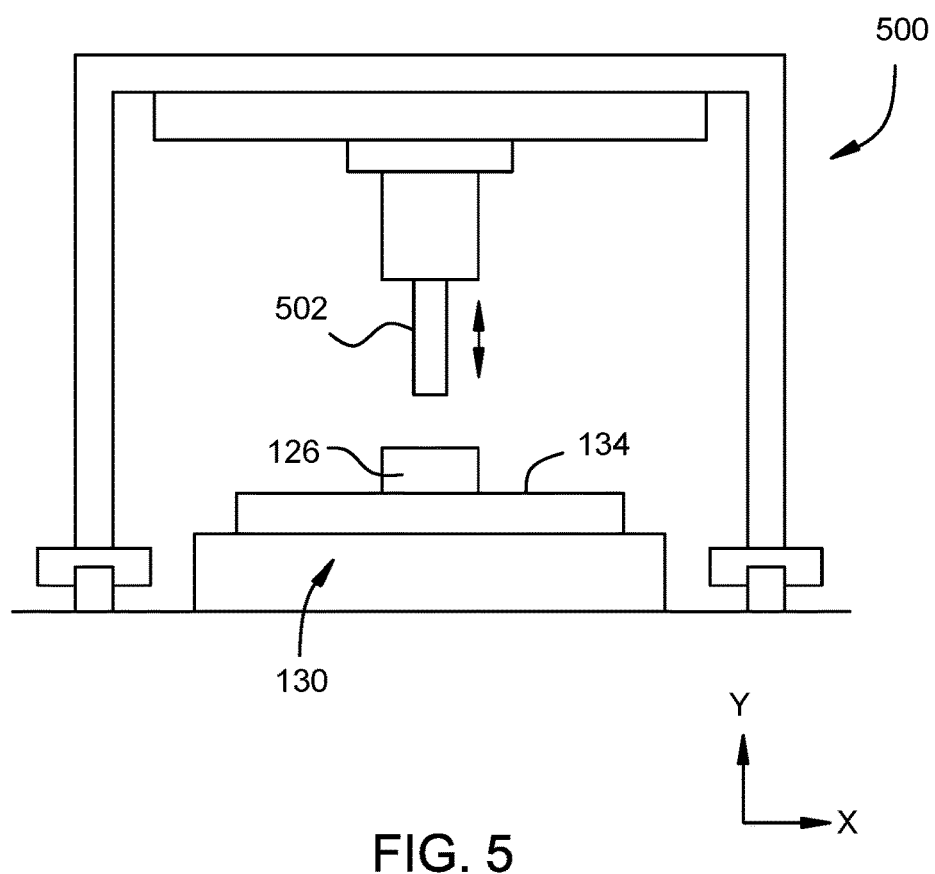
FIG. 5 is a schematic side view of a portion of a test station illustrating a pusher for seating a chip package assembly in an interface of the test station.

In some instances, the chip package assembly 126 may need to be urged into proper contact with the interface 134 of the test station 130. Although properly seating the chip package assembly 126 in proper contact with the interface 134 of the test station 130 may be accomplished utilizing many techniques, one example is provided in FIG. 5, which utilizes a gantry 500 to position a pusher 502 over the chip package assembly 126. The gantry 500 may be any suitable X-Y positioning device. The pusher 502 may be any suitable linear actuator, such as a pneumatic actuator or motorized actuator.

Figure 6:
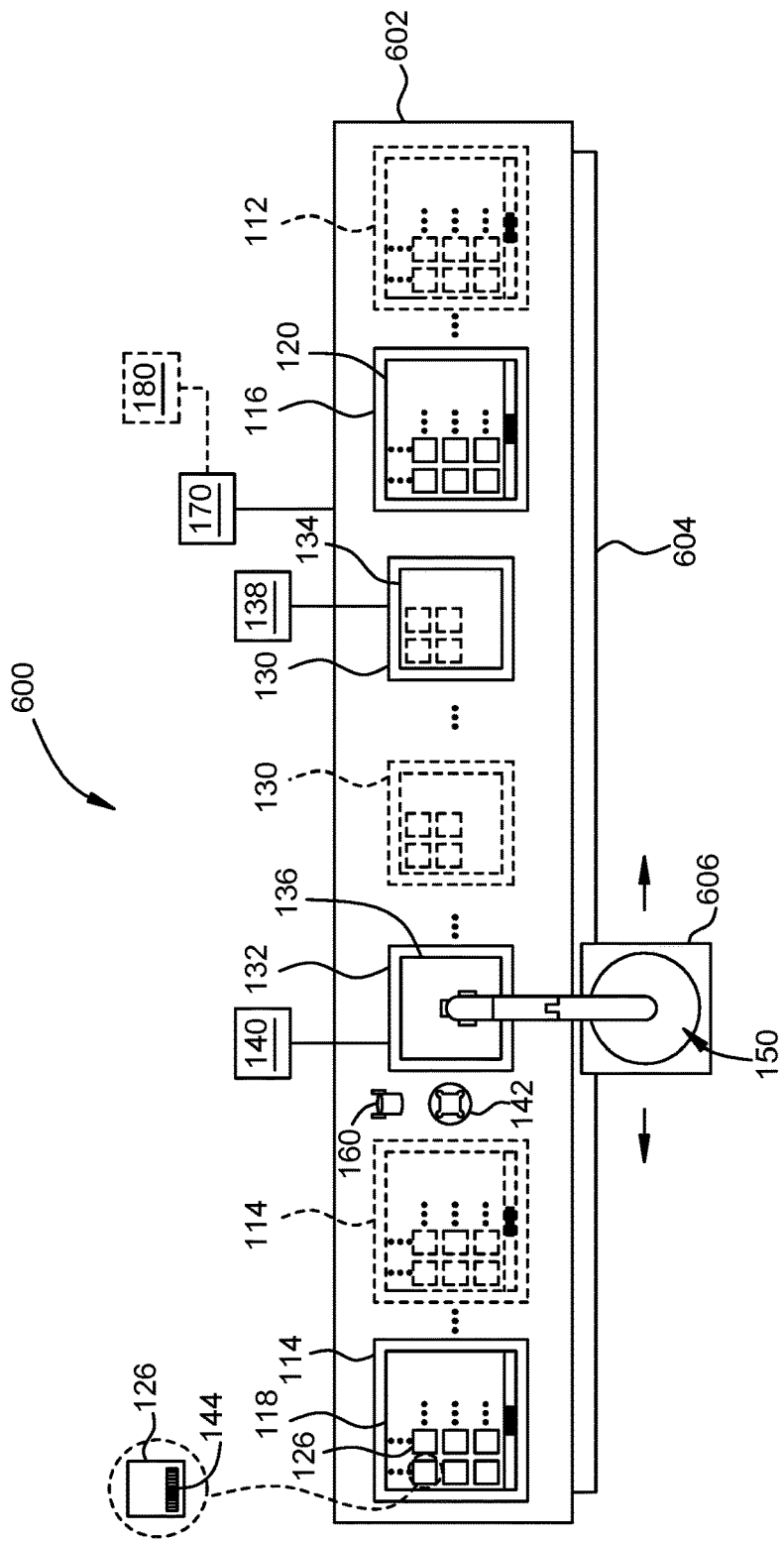
FIG. 6 is a schematic top view of another chip package assembly testing system.

FIG. 6 is a schematic top view of another chip package assembly testing system 600. The chip package assembly testing system 600 is generally similar to the chip package assembly testing system 100 described above, except wherein the stations 114, 116, 130, 132 are arranged along a rail 604 on which the robot 150 travels as opposed to being radially arranged around the robot 150. Some stations are shown in dashed lines in FIG. 6 to indicate that two or more stations of a particular type may be utilized.

The testing system 600 generally includes a base 602 on which the stations 114, 116, 130, 132 are disposed. In one embodiment, at least three of the stations 114, 116, 130, 132 are generally aligned in a linear arrangement. The precisor 142 may also be arranged substantially linearly with the stations 114, 116, 130, 132. In one example, the precisor 142 is located between the queuing station 114 and a test station 130.

The robot 150 is arranged to move laterally within the testing system 600. For example, the robot 150 may be linearly between the stations 114, 116, 130, 132. In the example depicted in FIG. 6, the robot 150 is mounted to a guide 606 that travels along a rail 604 that is affixed to the base 602. Alternatively, the guide 606 may be suspended or affixed to a ceiling or enclosure 102 (shown in FIG. 1). It is contemplated that more than one robot 150 may be utilized to increase the efficiency of transfer between the stations 114, 116, 130, 132. Although not shown, two or more additional robots 150 may be utilized. For example, one or more robots 150 may be moveably attached to the rail 604 to move chip package assemblies 126 between the input queuing station(s) 114 and test station(s) 130, 132, while one or more additional robots 150 may be moveably attached to the rail 604 to move chip package assemblies 126 between test station(s) 130, 132 and unloading queuing station(s) 116.

The linear arrangement of the testing system 600 allows more queuing or testing stations to be utilized with minimal impact to floor space requirements. Moreover, the linear arrangement of the testing system 600 enables the robot 150 to perform faster transfers.

Figure 7:
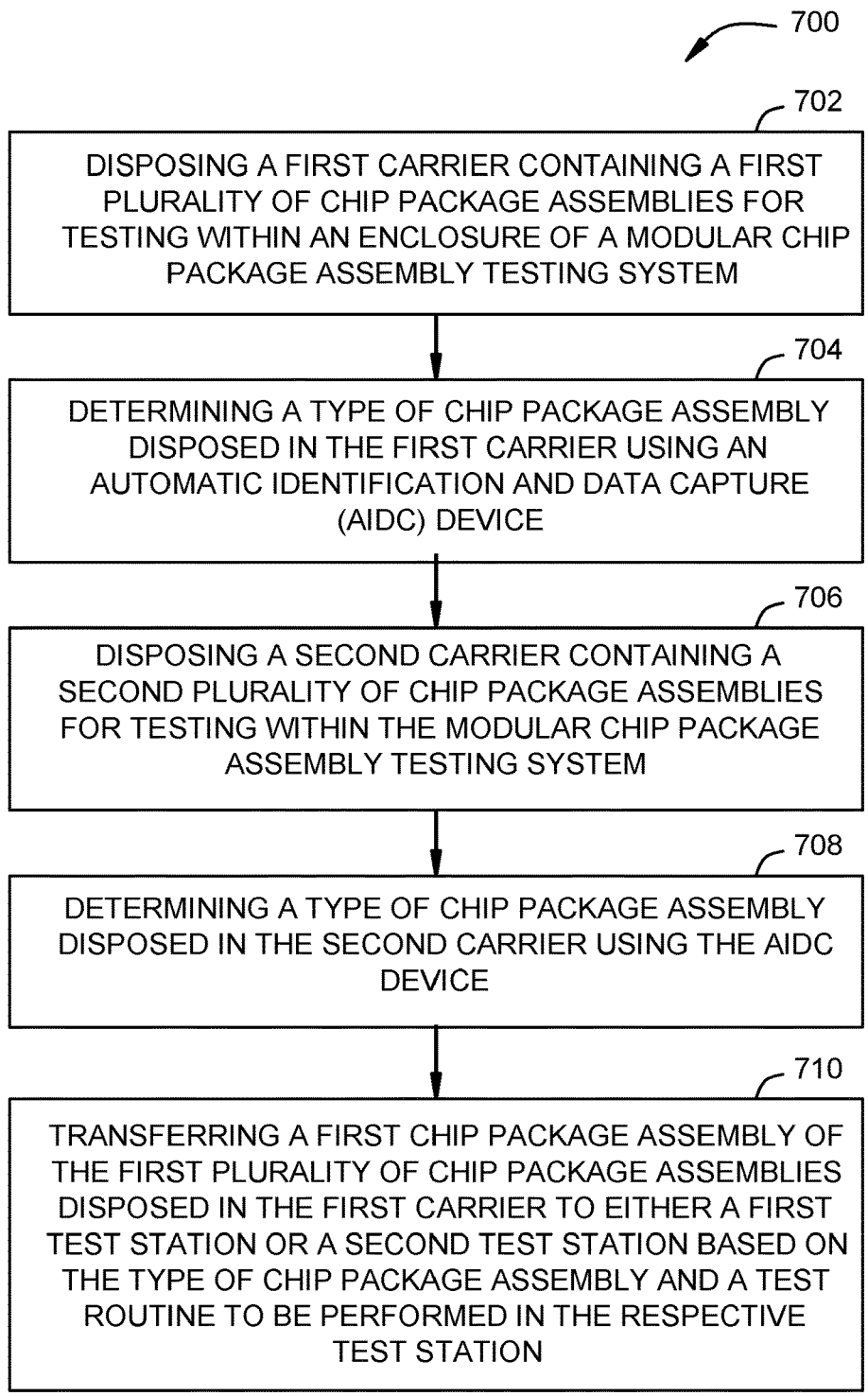
FIG. 7 is a flow diagram of a method for testing a chip package assembly in a chip package assembly testing system.

FIG. 7 is a flow diagram of another method 700 for testing a chip package assembly 126 in a chip package assembly testing system, such as, for example, the chip package assembly testing systems 100, 600 described above among others. The method 700 begins at operation 702 by disposing a first carrier 118 containing a first plurality of chip package assemblies 126 for testing within an enclosure 102 of the modular chip package assembly testing system 100, 600. At operation 704, information associated with one of the chip package assembly 126 retrieved from the first carrier 118 is determined using an AIDC device 160 that reads a machine readable information tag 122 associated with chip package assembly 126. The readable information tag 122 may be disposed on either the chip package assembly 126 or the first carrier 118. The unique identification of the information tag 122 associated with the first carrier 118 (or chip package assembly 126) read by the AIDC device 160 is provided to a controller 170 that stores or has access to information regarding the chip package assemblies 126 disposed on the first carrier 118, such as but not limited to the type of chip package assemblies 126 present in the first carrier 118 and thus, associated with the tag 122. The AIDC device 160 is disposed in the enclosure 102, and may be coupled to a robot 150 disposed in the enclosure 102 and utilized to move the chip package assemblies 126 within the enclosure 102. Alternatively, the AIDC device 160 may be disposed in another suitable location within the enclosure 102.

At operation 706, a second carrier 120 containing a second plurality of chip package assemblies 126 for testing is disposed within the modular chip package assembly testing system 100, 600. At operation 708, the type of chip package assembly 126 disposed in or retrieved from the second carrier 120 is determined using the AIDC device 160 in the same manner as described at operation 704.

At operation 710, a first chip package assembly 126 of the first plurality of chip package assemblies 126 disposed in the first carrier 118 is transferred to either a first test station 130 or a second test station 132 of the testing system 100, 600 based on the type of chip package assembly 126 and a predefined test routine to be performed in the respective test station 130, 132. For example, if the type of chip package assembly 126 being transferred by the robot 150 requires testing utilizing a predefined test routine located in test station 130 while a different predefined test routine located is loaded in test station 132, the robot 150 will transfer (i.e., route) the chip package assembly 126 to the test station 130 for testing. Alternatively, a first chip package assembly 126 of the first plurality of chip package assemblies 126 disposed in the first carrier 118 is transferred to either a first test station 130 or a second test station 132 of the testing system 100, 600 based on a configuration of the interface 134, 136 and the predetermined test routine disposed in at least one of the test stations 130, 132. For example, if the type of chip package assembly 126 being transferred by the robot 150 requires testing utilizing a predefined test routine located in test station 130 and has electrical connections that is configured to mate with the interface 134 while a different predefined test routine located and foreign interface is loaded in test station 132, the robot 150 will transfer (i.e., route) the chip package assembly 126 to the test station 130 for testing.

The method 700 may also include returning the first chip package assembly 126 to a region of the first carrier 118 after testing based on test results of the first chip package assembly 126. For example, the robot 150 may transfer the chip package assembly 126 having passing test result to one region of the first carrier 118 while transferring chip package assembly 126 having failing test result to a different region of the first carrier 118, thus sorting passing and failing chip package assemblies 126.

The method 700 may also include communicating the test results of the first chip package assembly 126 and the location of the first chip package assembly 126 in the first carrier 118 (or other carrier) to a host processing system 180 disposed remote from the chip package assembly testing system 100, 600.

The method 700 may also include returning the first chip package assembly 126 to the first carrier 118 after testing in response to acceptable test results of the first chip package assembly 126, and returning the first chip package assembly 126 to a different carrier after testing in response to unacceptable test results of the first chip package assembly 126. For example, the robot 150 may transfer the chip package assembly 126 having passing test result to the first carrier 118 while transferring chip package assembly 126 having failing test result to the different carrier, thus sorting passing and failing chip package assemblies 126.

The method 700 may also include transferring a first chip package assembly 126 of the second plurality of chip package assemblies 126 disposed in the second carrier 120 to either the first test station 130 or the second test station 132 based on the type of chip package assembly 126 and a test routine to be performed on the respective test station, wherein the first chip package assembly 126 of the first plurality of chip package assemblies 126 and the first chip package assembly 126 of the second plurality of chip package assemblies 126 are different types, and wherein the first test station 130 or the second test station 132 are configured to perform different tests.

Thus, a chip package assembly test system has been provided which improve testing throughput without increasing space requirements as compared to conventional test systems. The chip package assembly testing system may be configured to simultaneously test different types of testing chip package assemblies. The chip package assembly testing system may also be configured to sort tested chip package assemblies for more efficient handling. Advantageously, the modularly of the chip package assembly testing system allow additional queuing or test stations provides additional flexibility to meet changing production demands with limited additional capital expenditures or down time for system reconfiguration. Moreover, the chip package assembly testing system may be configured with stations surrounding and served by a single robot in applications where a small tool footprint in required, or configured in a linear arrangement that enables a greater number of stations to be utilized for faster throughput equating to a reduced unit cost per chip package assembly.

While the foregoing is directed to embodiments of the present invention, other and further embodiments of the invention may be devised without departing from the basic scope thereof, and the scope thereof is determined by the claims that follow.

What is claimed is:

1. A modular chip package assembly testing system comprising:
    a first queuing station configured to receive a first carrier containing a plurality of chip package assemblies for testing within the modular chip package assembly testing system;
    a second queuing station configured to receive a second carrier containing a plurality of chip package assemblies for testing within the modular chip package assembly testing system;
    a plurality of test stations including at least a first test station and a second test station, each test station comprising:
        an interface configured to receive and communicatively connect with at least one chip package assembly; and
        a test processor configured to test the chip package assembly connected through the interface utilizing a predetermined test routine associated with each test station;
    a robot having a range of motion operable to transfer a chip package assembly between any of the first queuing station, the second queuing station and the plurality of test stations;
    an automatic identification and data capture (AIDC) device operable to read an identification tag affixed to a carrier disposed in the first and second queuing stations or affixed to chip package assembly disposed in the testing system; and
    a controller configured to control placement of chip package assemblies by the robot in response information obtained from reading the identification tag coupled to a carrier disposed in at least one of the first and second queuing stations, the predefined test routine of the test processor of the first test station, and the predefined test routine of the test processor of the second test station.

2. The modular chip package assembly testing system of claim 1, wherein the AIDC device is coupled to the robot.

3. The modular chip package assembly testing system of claim 2, wherein the AIDC device comprises an RFID reader or a bar code reader.

4. The modular chip package assembly testing system of claim 1, wherein the controller is further configured to control placement of a tested chip package assembly based on test results of the tested chip package assembly.

5. The modular chip package assembly testing system of claim 4, wherein the first queuing station is further configured to receive a third carrier.

6. The modular chip package assembly testing system of claim 5, wherein the controller is further configured place the tested chip package assembly either the first carrier or third carrier based on test results of the tested chip package assembly.

7. The modular chip package assembly testing system of claim 5, wherein first queuing station is configured to retain the first carrier and the third carrier in a stacked orientation.

8. The modular chip package assembly testing system of claim 1 further comprising:
    an enclosure having in interior region, the queuing stations and the plurality of test stations disposed in the interior region of the enclosure.

9. The modular chip package assembly testing system of claim 8, wherein the enclosure further comprises:
    a first access port disposed immediately adjacent the first queuing station, the first access port openable to allow removal of a carrier disposed on the first queuing station from the enclosure.

10. The modular chip package assembly testing system of claim 9, wherein the enclosure further comprises:
a second access port disposed immediately adjacent the second queuing station, the second access port openable to allow removal of a carrier disposed on the second queuing station from the enclosure.

11. The modular chip package assembly testing system of claim 1, wherein the test processor of the first test station and the test processor of the second test station are configured with different predetermined test routines.

12. The modular chip package assembly testing system of claim 1, wherein the test processor of the first test station is configured to run a least one of a DC test routine, a burn-in routine or a final test routine.

13. The modular chip package assembly testing system of claim 11, wherein the controller is further configured to control placement of an untested chip package assembly based on a configuration of the interface and the predetermined test routine disposed in at least one of the test stations.

14. The modular chip package assembly testing system of claim 13, wherein first queuing station and the testing stations are linearly aligned.

15. A method for testing a chip package assembly, the method comprising:
disposing a first carrier containing a first plurality of chip package assemblies for testing within an enclosure of a modular chip package assembly testing system;
moving an automatic identification and data capture (AIDC) device coupled to a robot to a position that enables a type of chip package assembly disposed in the first carrier to be determined using the AIDC device coupled to the robot;
disposing a second carrier containing a second plurality of chip package assemblies for testing within the modular chip package assembly testing system;
moving the AIDC device coupled to the robot to a position that enables a type of chip package assembly disposed in the second carrier to be determined using the AIDC device; and
transferring, via the robot, a first chip package assembly of the first plurality of chip package assemblies disposed in the first carrier to either a first test station or a second test station based on the type of chip package assembly and a test routine to be performed in the respective test station.

16. The method of claim 15 further comprising:
returning the first chip package assembly to a location on the first carrier after testing based on test results of the first chip package assembly.

17. The method of claim 16 further comprising:
communicating the test results of the first chip package assembly and the location of the first chip package assembly in the first carrier to a host processing system disposed remote from the chip package assembly testing system.

18. The method of claim 15 further comprising:
returning the first chip package assembly to the first carrier after testing in response to acceptable test results of the first chip package assembly; and
returning the first chip package assembly to a third carrier after testing in response to unacceptable test results of the first chip package assembly.

19. The method of claim 15 further comprising:
transferring a first chip package assembly of the second plurality of chip package assemblies disposed in the second carrier to either the first test station or the second test station based on the type of chip package assembly and a test routine to be performed on the respective test station, wherein the first chip package assembly of the first plurality of chip package assemblies and the first chip package assembly of the second plurality of chip package assemblies are different types, and wherein the first test station or the second test station are configured to perform different tests.

20. The method of claim 15 further comprising:
sorting chip package assemblies having acceptable test results from chip package assemblies having unacceptable test results.

* * * * *